(12) United States Patent
Min et al.

(10) Patent No.: US 11,973,173 B2
(45) Date of Patent: Apr. 30, 2024

(54) DISPLAY DEVICE

(71) Applicant: Samsung Display Co., LTD., Yongin-si (KR)

(72) Inventors: Jinsic Min, Hwaseong-si (KR); Changsub Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 417 days.

(21) Appl. No.: 17/372,692

(22) Filed: Jul. 12, 2021

(65) Prior Publication Data
US 2022/0085261 A1 Mar. 17, 2022

(30) Foreign Application Priority Data

Sep. 17, 2020 (KR) .................. 10-2020-0119712

(51) Int. Cl.
*H01L 33/62* (2010.01)
*G09G 3/32* (2016.01)
*H01L 27/15* (2006.01)

(52) U.S. Cl.
CPC .............. *H01L 33/62* (2013.01); *G09G 3/32* (2013.01); *H01L 27/156* (2013.01)

(58) Field of Classification Search
None
See application file for complete search history.

(56) References Cited

U.S. PATENT DOCUMENTS

| 6,466,047 B1 * | 10/2002 | Doherty | G01R 1/07385 |
| | | | 324/750.25 |
| 6,940,301 B2 * | 9/2005 | Chen | G01R 31/70 |
| | | | 349/149 |
| 8,305,094 B2 | 11/2012 | Chang | |
| 11,309,380 B2 * | 4/2022 | Kim | G02F 1/13458 |
| 2008/0048708 A1 * | 2/2008 | Hsu | G09G 3/006 |
| | | | 324/754.03 |
| 2015/0160276 A1 * | 6/2015 | Moon | G09G 3/006 |
| | | | 702/65 |
| 2018/0188289 A1 * | 7/2018 | Qu | G01R 1/06794 |

(Continued)

FOREIGN PATENT DOCUMENTS

| KR | 10-0806910 A | 2/2008 |
| KR | 10-1765656 B1 | 8/2017 |

(Continued)

*Primary Examiner* — Robert K Carpenter
(74) *Attorney, Agent, or Firm* — CANTOR COLBURN LLP

(57) ABSTRACT

A display device includes a substrate including a display region and a pad region, a driving integrated circuit contacting the substrate at the pad region and including first to third test bumps receiving test signals and a circuit wire connected to each of the first to third test bumps, test pads in the pad region, through which the test signals are provided to the driving integrated circuit and including first to tenth test pads, and connection wires in the pad region, through which the test signals are provided to the test bumps from the test pads and including a first connection wire connecting the first test pad to the first test bump, second and third connection wires connecting the second and third test pads, respectively, to the second test bump, and fourth and fifth connection wires connecting the fourth and fifth test pads, respectively, to the third test bump.

19 Claims, 7 Drawing Sheets

(56) References Cited

U.S. PATENT DOCUMENTS

2019/0027076 A1   1/2019  Lee et al.
2019/0064239 A1*  2/2019  Lee ........................ G01R 31/70
2022/0132658 A1*  4/2022  Meng ................. H05K 13/0076

FOREIGN PATENT DOCUMENTS

| KR | 1020180110710 A | 10/2018 |
| KR | 20190009457 A | 1/2019 |
| KR | 10-1971066 A | 4/2019 |

\* cited by examiner

DISPLAY DEVICE

This application claims priority to Korean Patent Application No. 10-2020-0119712 filed on Sep. 17, 2020, and all the benefits accruing therefrom under 35 U.S.C. § 119, the entire disclosure of which is incorporated herein by reference.

BACKGROUND

1. Field

Embodiments relate generally to a display device. More particularly, embodiments of the invention relate to a display device including a driving integrated circuit.

2. Description of the Related Art

Flat panel display devices are used as display devices which replace a cathode ray tube display device, due to lightweight and thin characteristics of the flat panel display devices. As representative examples of such flat panel display devices, there are a liquid crystal display device and an organic light emitting diode display device.

The display device may include a substrate, and the substrate may be divided into a display region and a pad region. A display structure may be disposed on the substrate in the display region thereof, and an image may be displayed through the display structure. A driving integrated circuit, pads, and the like may be disposed on the substrate in the pad region thereof.

SUMMARY

Embodiments provide a display device including a driving integrated circuit.

According to an embodiment, a display device includes a substrate, a display structure, a driving integrated circuit, first to tenth test pads, a first connection wire, second and third connection wires, and fourth and fifth connection wires. The substrate includes a display region and a pad region. The display structure is in the display region on the substrate. The driving integrated circuit is in the pad region on the substrate, and includes a circuit part, first and second test bumps, a third test bump, and a circuit wire. The circuit part includes first to fourth regions. The first and second test bumps are in the first region on a bottom surface of the circuit part. The third test bump is in the second region on the bottom surface of the circuit part. The circuit wire is embedded in the circuit part, and connected to the first to third test bumps. The first to tenth test pads are in the pad region on the substrate while being spaced apart from the driving integrated circuit, and are arranged along a first direction. The first connection wire is connected to the first test pad and the first test bump. The second and third connection wires are connected to the second and third test pads, respectively, and are connected to the second test bump. The fourth and fifth connection wires are connected to the fourth and fifth test pads, respectively, and are connected to the third test bump.

In embodiments, the first region and the third region may be spaced apart from each other along the first direction, and the second region and the fourth region may be spaced apart from each other along the first direction. The first region and the second region may be spaced apart from each other along a second direction that is different from the first direction, and the third region and the fourth region may be spaced apart from each other along the second direction.

In embodiments, the driving integrated circuit may further include fourth and fifth test bumps in the third region.

In embodiments, the circuit wire may be connected to the first to fifth test bumps.

In embodiments, the display device may further include sixth and seventh connection wires connected to the sixth and seventh test pads, respectively, and may be connected to the fourth test bump.

In embodiments, the driving integrated circuit may further include a plurality of output signal bumps between the first and second test bumps in the first region and fourth and fifth test bumps in the third region.

In embodiments, the output signal bumps may be electrically connected to the display structure.

In embodiments, the driving integrated circuit may further include a sixth test bump in the fourth region.

In embodiments, the circuit wire may be connected to the first to sixth test bumps.

In embodiments, the display device may further include eighth and ninth connection wires and a tenth connection wire. The eighth and ninth connection wires may be connected to the eighth and ninth test pads, respectively, and may be connected to the sixth test bump. The tenth connection wire may be connected to the tenth test pad and the fifth test bump.

In embodiments, the driving integrated circuit may further include a plurality of input signal bumps between the third test bump in the second region and the sixth test bump in the fourth region.

In embodiments, the display device may further include a plurality of signal pads adjacent to the first to tenth test pads.

In embodiments, the input signal bumps may be electrically connected to the signal pads.

In embodiments, the driving integrated circuit may include first, second, third, and fourth corners. The first and second test bumps may be adjacent to the first corner, and the third test bump may be adjacent to the second corner. The fourth and fifth test bumps may be adjacent to the third corner, and the sixth test bump may be adjacent to the fourth corner.

In embodiments, the pad region may be in one side of the display region.

Since one or more embodiment of the display device includes the circuit wire electrically connecting the first to sixth test bumps to each other, the driving integrated circuit may include six test bumps in the first to fourth regions, and the display device may include ten test pads. In other words, the absence or presence of a contact failure between the substrate and the driving integrated circuit may be inspected by using the first to sixth test bumps and the first to tenth test pads. Accordingly, a dead space of the display device may be relatively reduced.

BRIEF DESCRIPTION OF THE DRAWINGS

Embodiments can be understood in more detail from the following description taken in conjunction with the accompanying drawings.

DETAILED DESCRIPTION

Figure 1:
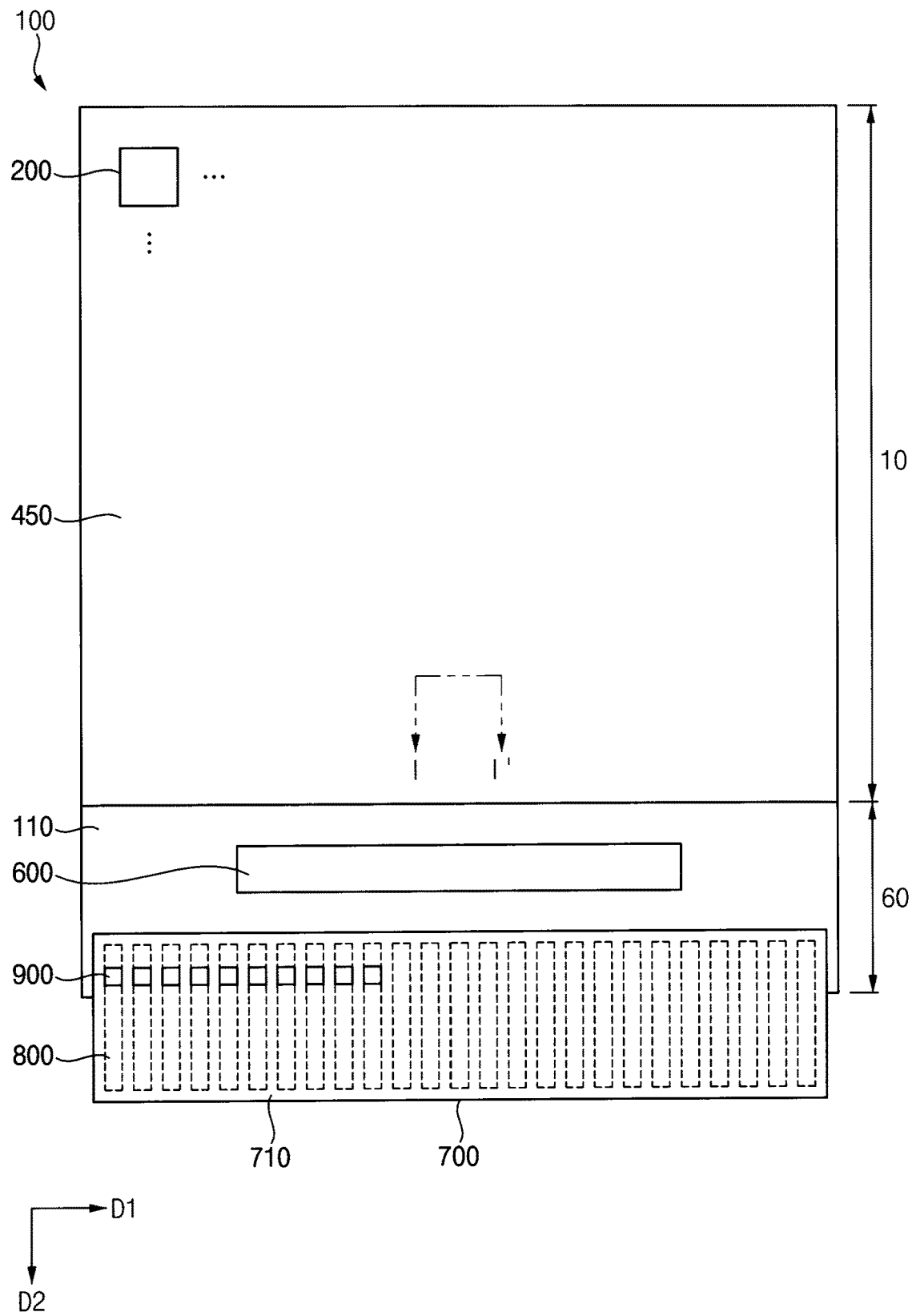
FIG. 1 is a plan view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In a process of providing or manufacturing a display device 100 including a driving integrated circuit 600, signal input pads and the like disposed on the substrate 110 at the pad region 60 thereof, after the driving integrated circuit 600 is provided or formed on the substrate 110, a contact status (e.g., electrical contact) between the driving integrated circuit 600 and the substrate 110 may be inspected to determine the presence or absence of a contact failure. A portion of the signal input pads may function as a test or inspection pad for inspecting the contact status between the driving integrated circuit 600 and the substrate 110.

Hereinafter, a display device 100 and a method of inspecting a contact status between a substrate 110 and a driving integrated circuit 600 that are each included in the display device 100 will be described in detail with reference to the accompanying drawings. In the accompanying drawings, same or similar reference numerals refer to the same or similar elements.

Figure 2:
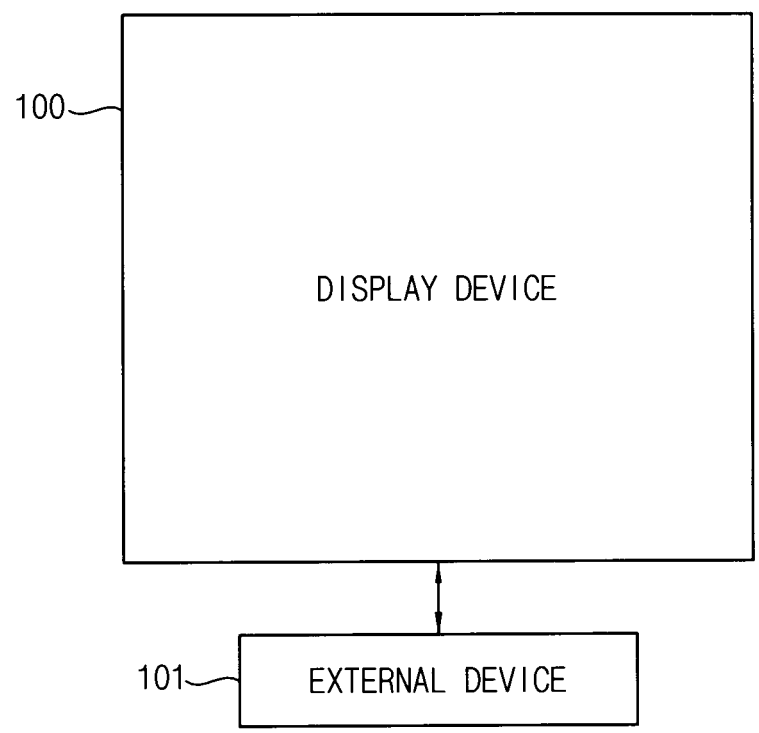
FIG. 2 is a block diagram for describing an embodiment of an external device electrically connected to the display device.

FIG. 1 is a plan view showing an embodiment of a display device 100, and FIG. 2 is a block diagram for describing an embodiment of an external device 101 electrically connected to the display device 100.

Figure 5:
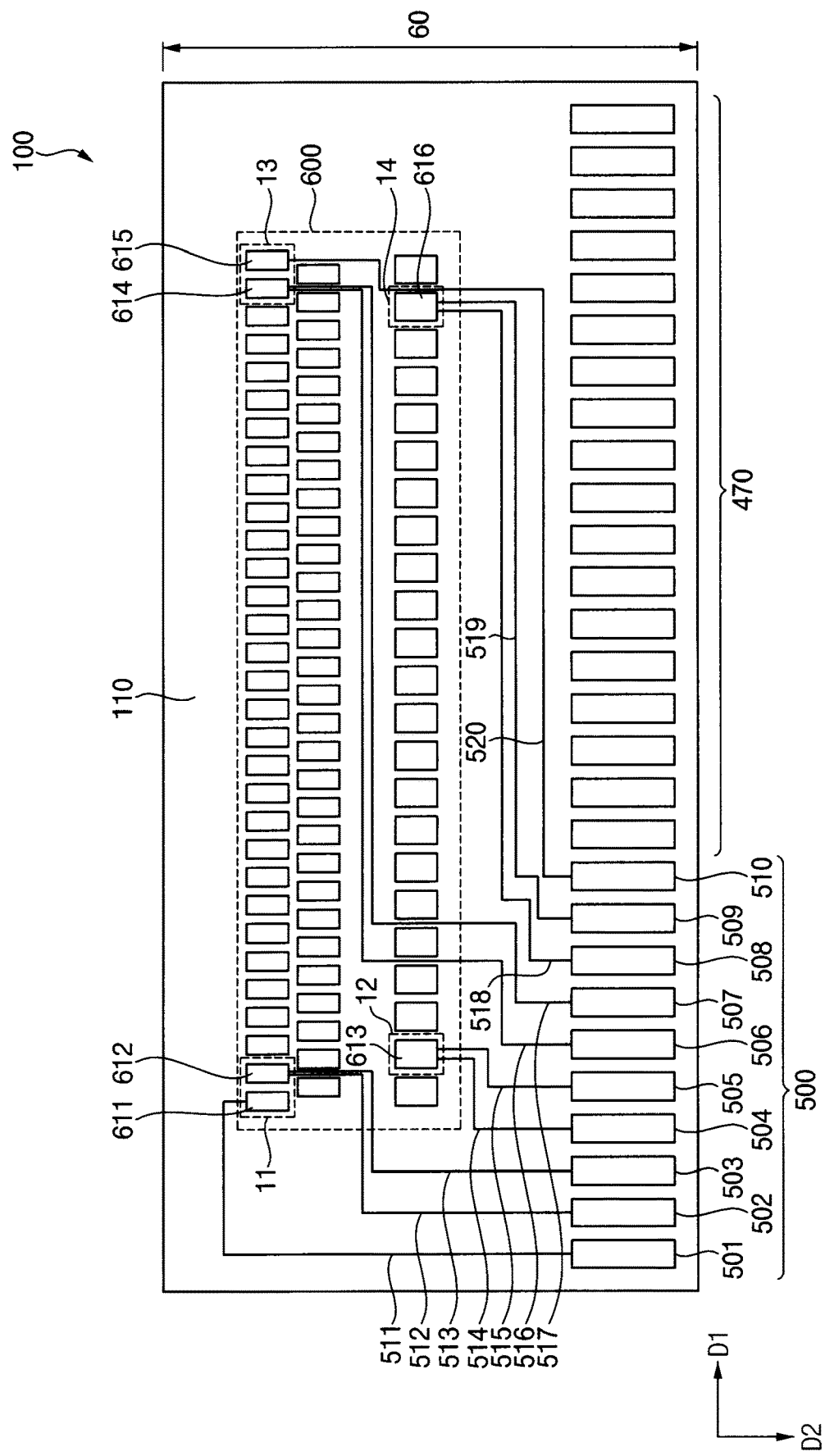
FIG. 5 is a partially enlarged plan view showing an embodiment of a pad region of the display device of FIG. 1.

Referring to FIGS. 1, 2, and 5, a display device 100 may include a substrate 110, a display structure 200, a thin film encapsulation structure 450, test pads 500 of the substrate 110 (see FIG. 5), signal pads 470 of the substrate 110 (see FIG. 5), first to tenth connection wires 511, 512, 513, 514, 515, 516, 517, 518, 519, and 520 of the substrate 110 (see FIG. 5), a driving integrated circuit 600, a flexible circuit board 700, and the like. In this case, the substrate 110 may include a display region 10 and a pad region 60 adjacent to a side of the display region 10. In addition, the flexible circuit board 700 may include a base substrate 710, a bump electrode 800 provided in plural including bump electrodes 800, and a test point 900 provided in plural including test points 900. Moreover, the test pads 500 may include first to tenth test pads 501, 502, 503, 504, 505, 506, 507, 508, 509, and 510.

The substrate 110 including a transparent or opaque material may be provided. The substrate 110 may be a transparent resin substrate. An example of the transparent resin substrate that may be used as the substrate 110 includes a polyimide substrate. In this case, the polyimide substrate may include a first polyimide layer, a barrier film layer, a second polyimide layer, and the like. In embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like.

The display structure 200 may be disposed in the display region 10 on the substrate 110. An image (e.g., a video image, still image, etc.) may be displayed in the display region 10 through the display structure 200.

The thin film encapsulation structure 450 may be disposed in the display region 10 on the display structure 200. The thin film encapsulation structure 450 may reduce or effectively prevent the display structure 200 from deteriorating due to penetration of moisture, oxygen, and the like. In addition, the thin film encapsulation structure 450 may perform a function of protecting the display structure 200 from an external impact. In embodiments, instead of the thin film encapsulation structure 450, an encapsulation substrate may be disposed on the display structure 200. The encapsulation substrate may face the substrate 110, and may not be disposed in the pad region 60 (e.g., may be excluded from the pad region 60). The encapsulation substrate may include substantially the same material as the substrate 110. In an embodiment, for example, the encapsulation substrate may include a quartz substrate, a synthetic quartz substrate, a calcium fluoride substrate, a fluorine-doped quartz substrate, a soda lime glass substrate, a non-alkali glass substrate, and the like.

As shown in FIG. 5, the test pads 500 and the signal pads 470 may be disposed in the pad region 60 on the substrate 110.

The test pads 500 may be arranged along a first direction D1 parallel to a top surface of the substrate 110 while being spaced apart from each other. The test pads 500 may be electrically connected to the driving integrated circuit 600 through first to tenth connection wires 511, 512, 513, 514, 515, 516, 517, 518, 519, and 520, respectively. The test pads 500 may be used in a process of inspecting a contact status (e.g., electrical contact) between the substrate 110 and the driving integrated circuit 600 to determine the presence or absence of a contact failure between the two elements.

The signal pads 470 may be adjacent to the test pads 500 along the first direction D1, and may be arranged along the first direction D1 while being spaced apart from each other. The pad region 60 may include an outer edge of the substrate 110. The signal pads 470 and the test pads 500 may be arranged along the outer edge of the substrate 110 which is furthest from the display region 10.

The signal pads 470 of the substrate 110 may be electrically connected to the driving integrated circuit 600 through substrate connection wires of the substrate 110. The signal pads 470 may electrically connect the display device 100 to an external device 101. In an embodiment, for example, the external device 101 may generate and/or provide an electrical signal such as a gate signal, a data signal, a gate initialization signal, an initialization voltage, an emission control signal, a power supply voltage, and the like. The external device 101 may be electrically connected to the display device 100 through the flexible circuit board 700 and the signal pads 470, and may provide the gate signal, the data signal, the gate initialization signal, the initialization voltage, the emission control signal, the power supply voltage, and the like to the display structure 200.

Each of the test pads 500 and the signal pads 470 may include a metal, an alloy, metal nitride, conductive metal oxide, a transparent conductive material, and the like. These may be used alone or in combination with each other. In embodiments, each of the test pads 500 and the signal pads 470 may have a multilayer structure including a plurality of metal layers. In an embodiment, for example, the metal layers may have mutually different thicknesses, or may include mutually different materials.

The driving integrated circuit 600 may be disposed in the pad region 60 on the substrate 110 while being spaced apart from the test pads 500 and the signal pads 470 along a second direction D2 crossing the first direction D1. In an embodiment, the first direction D1 may be substantially orthogonal to the first direction D1 without being limited thereto. In other words, the driving integrated circuit 600 may be disposed between the display structure 200 and each of the test and signal pads 500 and 470 in the pad region 60 on the substrate 110.

Referring again to FIG. 1, the base substrate 710 may be located on the test pads 500 and the signal pads 470. That is, the base substrate 710 may face the test pads 500 and the signal pads 470 along a thickness direction of the display device 100. The thickness direction may be a third direction which crosses each of the first direction D1 and the second direction D2. The base substrate 710 may include a flexible film including a material having flexibility. In an embodiment, for example, the base substrate 710 may include a polyimide resin, a polyester resin, and the like.

The bump electrodes 800 may be disposed on a bottom surface of the base substrate 710 while being spaced apart from each other. The bump electrodes 800 are indicated as a dotted line feature in FIG. 1 to show a position on the bottom surface. The bottom surface of the base substrate 710 face the test pads 500 and the signal pads 470 along a thickness direction of the display device 100. A first end of each of the bump electrodes 800 may overlap or correspond to the test pads 500 and the signal pads 470, and the first end may be electrically connected to the test pads 500 and the signal pads 470 such as through an anisotropic conductive film. In addition, a second end opposing the first end of each of the bump electrodes 800 may overlap a printed circuit board ("PCB"), a flexible flat cable ("FFC"), and/or the external device 101 to be disposed facing corresponding conductive elements of the PCB, the FFC, or the external device 101, and may be electrically connected to the PCB, the FFC, or the external device 101 at the conductive elements thereof. The bump electrodes 800 may be electrically connected to the PCB, the FFC, or the external device 101 at the conductive elements thereof by any number of method such as through an anisotropic conductive film. Each of the bump electrodes 800 may include a metal, an alloy, metal nitride, conductive metal oxide, a transparent conductive material, and the like. These may be used alone or in combination with each other. In embodiments, each of the bump electrodes 800 may have a multilayer structure including a plurality of metal layers. In an embodiment, for example, the metal layers may have mutually different thicknesses, or may include mutually different materials.

The test points 900 may be disposed on a top surface of the base substrate 710. The test points 900 may be accessible for electrical connection such as by an inspection device. The test point 900 may overlap a part of the bump electrode 800, and may be electrically connected to the bump electrode 800 within the flexible circuit board 700. In an embodiment, for example, each of the test points 900 may include a copper foil. A probe pin as a testing tool may make contact with the test points 900 in the process of inspecting the contact status between the substrate 110 and the driving integrated circuit 600, and an inspection device connected to the probe pin may measure a resistance or a voltage through the probe pin. Accordingly, the flexible circuit board 700 including the base substrate 710, the bump electrodes 800 and the test points 900 may be provided.

Figure 3:
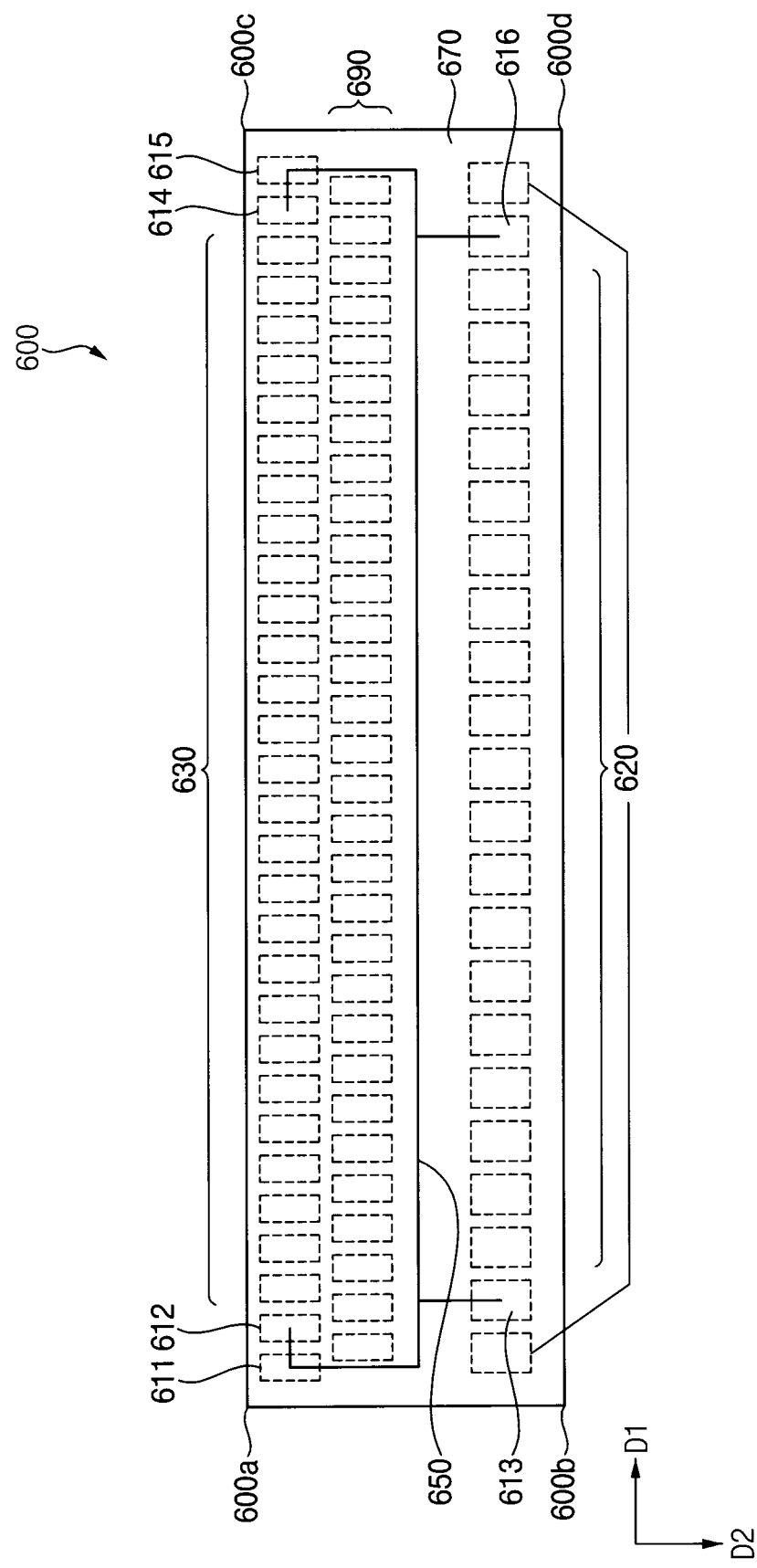
FIG. 3 is a plan view showing an embodiment of a driving integrated circuit included in the display device of FIG. 1.
Figure 4:
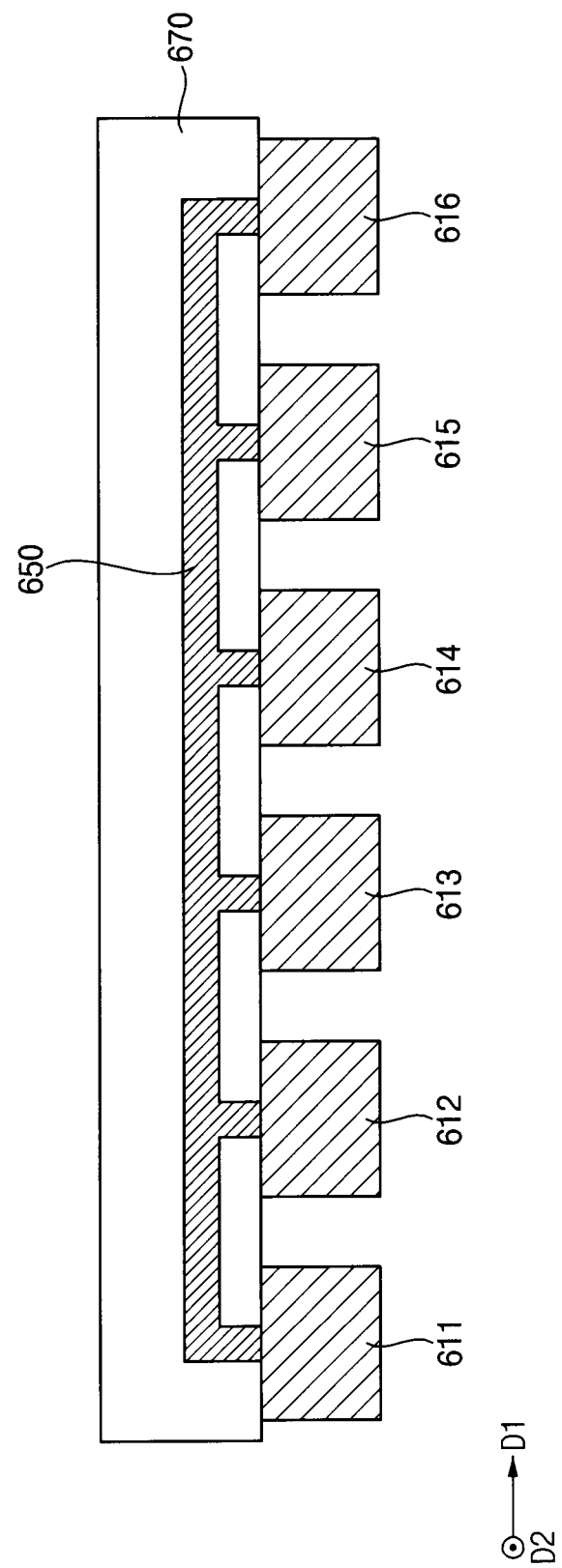
FIG. 4 is a cross-sectional view for describing an embodiment of a circuit wire and test bumps of the driving integrated circuit of FIG. 3.

FIG. 3 is a plan view showing an embodiment of a driving integrated circuit 600 included in the display device 100 of FIG. 1, and FIG. 4 is a cross-sectional view for describing a circuit wire 650 and various test bumps of the driving integrated circuit 600 of FIG. 3.

Referring to FIGS. 1, 3, 4, and 5, the driving integrated circuit 600 may include a circuit part 670, first to sixth test bumps 611, 612, 613, 614, 615, and 616, a circuit wire 650, a plurality of first output signal bumps 630, a plurality of second output signal bumps 690, and a plurality of input signal bumps 620. In addition, the driving integrated circuit 600 may include first, second, third, and fourth corners 600a, 600b, 600c, and 600d.

Moreover, as shown in FIG. 5, the circuit part 670 may include first to fourth regions 11, 12, 13, and 14. The first to fourth regions 11, 12, 13, and 14 respectively correspond to a testing bump region including one or more of various testing bumps of the driving integrated circuit 600. In an embodiment, for example, the first region 11 and the third region 13 may be spaced apart from each other along the first direction D1, the second region 12 and the fourth region 14 may be spaced apart from each other along the first direction D1, the first region 11 and the second region 12 may be spaced apart from each other along the second direction D2, and the third region 13 and the fourth region 14 may be spaced apart from each other along the second direction D2. In other words, the first region 11 may be adjacent to the first corner 600a, the second region 12 may be adjacent to the second corner 600b, the third region 13 may be adjacent to the third corner 600c, and the fourth region 14 may be adjacent to the fourth corner 600d. Among the various regions, the first region 11 is closest to the first corner 600a, the second region 12 is closest to the second corner 600b, the third region 13 is closest to the third corner 600c, and the fourth region 14 is closest to the fourth corner 600d.

A drive integrated circuit ("drive IC") chip may be embedded in the circuit part 670. The drive IC chip may be electrically connected to the input signal bumps 620 at a first side of the drive IC chip, through first circuit wires, and the drive IC chip may be electrically connected to the first output signal bumps 630 and the second output signal bumps 690 at a second side of the drive IC chip which is opposite to the first side thereof, through second circuit wires. The drive IC chip may receive an input signal (e.g., a data signal as an electrical signal) and a drive IC power supply voltage from the external device 101 of FIG. 2 through the signal pads 470, substrate connection wires which connect the signal pads 470 to the input signal bumps 620, and the input signal bumps 620. The drive IC chip may provide an output signal as an electrical signal to the display structure 200 through the first output signal bumps 630, the second output signal bumps 690, and substrate wires (e.g., a data wire) which connect the first and second output signal bumps 630 and 690 to the display structure 200 based on the input signal. That is, the external device 101 may provide an electrical signal such as the gate signal, the data signal, the gate initialization signal, the initialization voltage, the emission control signal, the power supply voltage, and the like to the display structure 200 via the flexible circuit board 700, the signal pads 470 and the driving integrated circuit 600.

In an embodiment, an anisotropic conductive film may be interposed between the first and second output signal bumps 630 and 690 and the substrate wires to electrically connect the first and second output signal bumps 630 and 690 to the substrate wires, so that the first output signal bumps 630 and the second output signal bumps 690 may be electrically connected to the display structure 200. In addition, an anisotropic conductive film may be interposed between the input signal bumps 620 and the substrate connection wires to electrically connect the anisotropic conductive film between the input signal bumps 620 and the substrate connection wires, so that the input signal bumps 620 may be electrically connected to the signal pads 470. Accordingly, the drive IC chip may control driving of the display structure 200.

In embodiments, the first and second test bumps 611 and 612 may be disposed in the first region 11 on a bottom surface of the circuit part 670, the third test bump 613 may be disposed in the second region 12 on the bottom surface of the circuit part 670, the fourth and fifth test bumps 614 and 615 may be disposed in the third region 13 on the bottom surface of the circuit part 670, and the sixth test bump 616 may be disposed in the fourth region 14 on the bottom surface of the circuit part 670. In other words, the first and second test bumps 611 and 612 may be adjacent to the first corner 600a, the third test bump 613 may be adjacent to the second corner 600b, the fourth and fifth test bumps 614 and 615 may be adjacent to the third corner 600c, and the sixth test bump 616 may be adjacent to the fourth corner 600d.

In an embodiment, for example, since the first to sixth test bumps 611, 612, 613, 614, 615, and 616 are variously disposed in the first to fourth regions 11, 12, 13, and 14, the contact status between the driving integrated circuit 600 and the substrate 110 at the first to fourth regions 11, 12, 13, and 14 may be measured.

However, although the first to fourth regions 11, 12, 13, and 14 have been described as being adjacent to the first, second, third, and fourth corners 600a, 600b, 600c, and 600d, respectively, the invention is not limited thereto. In an embodiment, for example, in embodiments, the first to fourth regions 11, 12, 13, and 14 may overlap or correspond to a region at which a contact failure between the driving integrated circuit 600 and the substrate 110 occurs relatively frequently.

Referring to FIG. 4, for example, the circuit wire 650 may be embedded in the circuit part 670, and may be connected to each of the first to sixth test bumps 611, 612, 613, 614, 615, and 616. The circuit part 670 may include a body portion of the driving integrated circuit 600. Various layers and components may be embedded within the body portion, such as the circuit wire 650, the drive IC chip, and the like. In an embodiment, the first to sixth test bumps 611, 612, 613, 614, 615, and 61 may each exposed outside of the body portion. In other words, the first to sixth test bumps 611, 612, 613, 614, 615, and 616 may be spaced apart from each other, while an electrical current may flow among the first to sixth test bumps 611, 612, 613, 614, 615, and 616 through the circuit wire 650.

The first output signal bumps 630 may be disposed between the first and second test bumps 611 and 612 disposed in the first region 11 and the fourth and fifth test bumps 614 and 615 disposed in the third region 13. In addition, the input signal bumps 620 may be disposed between the third test bump 613 disposed in the second region 12 and the sixth test bump 616 disposed in the fourth region 14. That is, the various test bumps may be outermost bumps within the driving integrated circuit 600, without being limited thereto. In embodiments, additional bumps of the input signal bumps 620 may be disposed on a left side of the third test bump 613 and/or a right side of the sixth test bump 616. In other words, the input signal bumps 620, the first output signal bumps 630, and the second output signal bumps 690 may also be disposed on the bottom surface of the circuit part 670.

Each of the first to sixth test bumps 611, 612, 613, 614, 615, and 616, the circuit wire 650, the first output signal bumps 630, the second output signal bumps 690, and the input signal bumps 620 may include a metal, an alloy, metal nitride, conductive metal oxide, a transparent conductive material, and the like. In an embodiment, for example, each of the first to sixth test bumps 611, 612, 613, 614, 615, and 616, the circuit wire 650, the first output signal bumps 630, the second output signal bumps 690, and the input signal bumps 620 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In embodiments, each of the first to sixth test bumps 611, 612, 613, 614, 615, and 616, the circuit wire 650, the first output signal bumps 630, the second output signal bumps 690, and the input signal bumps 620 may have a multilayer structure including a plurality of metal layers. In an embodiment, for example, the metal layers may have mutually different thicknesses, or may include mutually different materials.

Accordingly, the driving integrated circuit 600 including the circuit part 670, the first to sixth test bumps 611, 612, 613, 614, 615, and 616, the circuit wire 650, the first output signal bumps 630, the second output signal bumps 690, and the input signal bumps 620 may be disposed in the pad region 60 on the substrate 110.

FIG. 5 is a partially enlarged plan view showing an embodiment of a pad region 60 of the display device 100 of FIG. 1.

Referring to FIGS. 3, 4, and 5, the first connection wire 511 may connect the first test pad 501 to the first test bump 611. The first test pad 501 is connected to a respective test bump in one-to-one correspondence.

The second connection wire 512 may connect the second test pad 502 to the second test bump 612. The third connection wire 513 may connect the third test pad 503 to the second test bump 612. That is, the second connection wire 512 and the third connection wire 513 may be simultaneously connected to the second test bump 612 (e.g., a same test bump). In other words, the second and third connection wires 512 and 513 may be connected to the second and third test pads 502 and 503, respectively, and may each be connected to the second test bump 612. The second and third test pads 502 and 503 are connected to a same test bump.

The fourth connection wire 514 may connect the fourth test pad 504 to the third test bump 613. The fifth connection wire 515 may connect the fifth test pad 505 to the third test bump 613. That is, the fourth connection wire 514 and the fifth connection wire 515 may be simultaneously connected to the third test bump 613. In other words, the fourth and fifth connection wires 514 and 515 may be connected to the fourth and fifth test pads 504 and 505, respectively, and may each be connected to the third test bump 613. The fourth and fifth test pads 504 and 505 are connected to a same test bump.

The sixth connection wire 516 may connect the sixth test pad 506 to the fourth test bump 614. The seventh connection wire 517 may connect the seventh test pad 507 to the fourth test bump 614. That is, the sixth connection wire 516 and the seventh connection wire 517 may be simultaneously connected to the fourth test bump 614. In other words, the sixth and seventh connection wires 516 and 517 may be connected to the sixth and seventh test pads 506 and 507, respectively, and may each be connected to the fourth test bump 614. The sixth and seventh test pads 506 and 507 are connected to a same test bump.

The eighth connection wire 518 may connect the eighth test pad 508 to the sixth test bump 616. The ninth connection wire 519 may connect the ninth test pad 509 to the sixth test bump 616. That is, the eighth connection wire 518 and the ninth connection wire 519 may be simultaneously connected to the sixth test bump 616. In other words, the eighth and ninth connection wires 518 and 519 may be connected to the eighth and ninth test pads 508 and 509, respectively, and each may be connected to the sixth test bump 616. The eighth and ninth test pads 508 and 509 are connected to a same test bump.

The tenth connection wire 520 may connect the tenth test pad 510 to the fifth test bump 615. The tenth test pad 520 is connected to a respective test bump in one-to-one correspondence.

In embodiments, the first to fifth test pads 501, 502, 503, 504, and 505 may be disposed on a left side of the signal pads 470, and the sixth to tenth test pads 506, 507, 508, 509, and 510 may be disposed on a right side of the signal pads 470, instead of all the various test pads being on a same side of the signal pads 470.

A conventional display device may include three conventional test bumps in each of first to fourth conventional regions to inspect a contact status between a conventional substrate and a conventional driving integrated circuit. In other words, the conventional driving integrated circuit may include twelve conventional test bumps (e.g., three test bumps in each of first to fourth regions 11, 12, 13, and 14). Since the conventional driving integrated circuit includes twelve conventional test bumps, the conventional display device includes sixteen conventional test pads to inspect the contact status. In this case, each of the conventional flexible circuit board connected to the conventional test pads and a conventional pad region in which the convention test pads are disposed may have a relatively large planar area.

Since one or more embodiment of the display device 100 includes the circuit wire 650 which electrically connects the first to sixth test bumps 611, 612, 613, 614, 615, and 616 to each other, the driving integrated circuit 600 may include six test bumps in the first to fourth regions 11, 12, 13, and 14, and the display device 100 may include ten test pads. In other words, the contact status between the substrate 110 and the driving integrated circuit 600 may be inspected by using the first to sixth test bumps 611, 612, 613, 614, 615, and 616 of the driving integrated circuit 600 and the first to tenth test pads 501, 502, 503, 504, 505, 506, 507, 508, 509, and 510 of the substrate 110. Accordingly, a planar area which is occupied by various testing elements with the driving integrated circuit 600 and the substrate 110 (e.g., a dead space) of the display device 100 may be relatively reduced.

Figure 6:
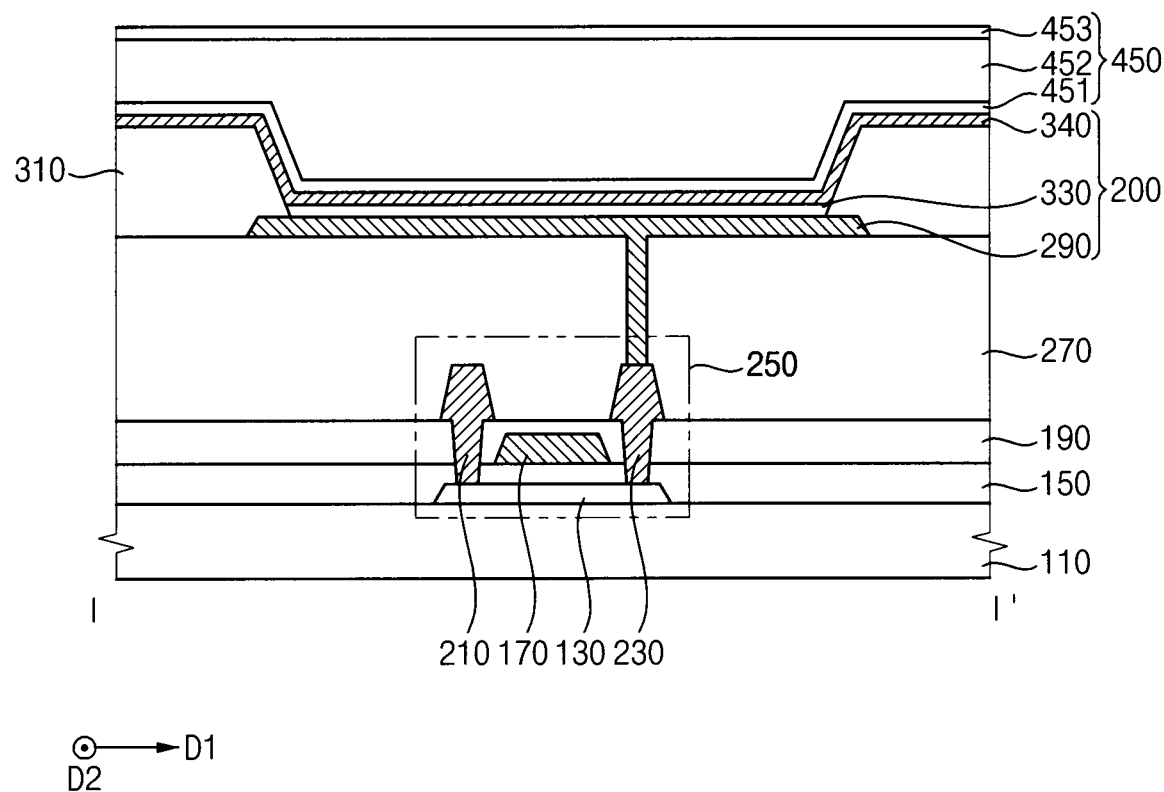
FIG. 6 is a cross-sectional view taken along line I-I' of FIG. 1.

FIG. 6 is a cross-sectional view taken along line I-I' of FIG. 1.

Referring to FIG. 6, the display device 100 may include a substrate 110, a semiconductor element 250, a planarization layer 270, a display structure 200, a pixel defining layer 310, and the like. In this case, the semiconductor element 250 may include an active layer 130, a gate insulating layer 150, a gate electrode 170, an interlayer insulating layer 190, a source electrode 210, and a drain electrode 230. In addition, the display structure 200 may include a lower electrode 290, a light emitting layer 330, and an upper electrode 340. Moreover, the thin film encapsulation structure 450 may include a first inorganic thin film encapsulation layer 451, an organic thin film encapsulation layer 452, and a second inorganic thin film encapsulation layer 453.

The substrate 110 may be provided. A buffer layer (not shown) may be disposed on the substrate 110. The buffer layer may reduce or effectively prevent metal atoms or impurities from diffusing from the substrate 110 to the semiconductor element 250, and may control a heat transfer rate during a crystallization process in providing or forming the active layer 130 to obtain a substantially uniform active layer. In addition, when a surface of the substrate 110 is not uniform, the buffer layer may serve to improve flatness of the surface of the substrate 110. Depending on a type of the substrate 110, at least two buffer layers may be provided on the substrate 110, or the buffer layer may be excluded. In an embodiment, for example, the buffer layer may include an organic material or an inorganic material.

The active layer 130 may be disposed on the substrate 110. The active layer 130 may include a metal oxide semiconductor, an inorganic semiconductor (e.g., amorphous silicon or poly silicon), an organic semiconductor, or the like. The active layer 130 may have source and drain regions.

The gate insulating layer 150 may be disposed on the active layer 130. In an embodiment, for example, the gate insulating layer 150 may sufficiently cover the active layer 130 on the substrate 110, and may have a substantially flat top surface without creating a step around the active layer 130. In embodiments, the gate insulating layer 150 may be disposed along a profile of the active layer 130 with a uniform thickness to cover the active layer 130 on the substrate 110. The gate insulating layer 150 may include a silicon compound, metal oxide, and the like. In an embodiment, for example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In embodiments, the gate insulating layer 150 may have a multilayer structure including a plurality of insulating layers. In an embodiment, for example, the insulating layers may have mutually different thicknesses, or may include mutually different materials.

The gate electrode 170 may be disposed on the gate insulating layer 150. The gate electrode 170 may be disposed on a portion of the gate insulating layer 150 under which the active layer 130 is located. The gate electrode 170 may include a metal, an alloy, metal nitride, conductive metal oxide, a transparent conductive material, and the like. These may be used alone or in combination with each other. In embodiments, the gate electrode 170 may include a multilayer structure including a plurality of metal layers. In an embodiment, for example, the metal layers may have mutually different thicknesses, or may include mutually different materials.

The interlayer insulating layer 190 may be disposed on the gate electrode 170. In an embodiment, for example, the interlayer insulating layer 190 may sufficiently cover the gate electrode 170 on the gate insulating layer 150, and may have a substantially flat top surface without creating a step around the gate electrode 170. In embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, and the like. In embodiments, the interlayer insulating layer 190 may have including a plurality of insulating layers. In an embodiment, for example, the insulating layers may have mutually different thicknesses, or may include mutually different materials.

The source electrode 210 and the drain electrode 230 may be disposed on the interlayer insulating layer 190. The source electrode 210 may be connected to a source region of the active layer 130 through a first contact hole extended through the gate insulating layer 150 and the interlayer insulating layer 190 such as by removing first portions of the gate insulating layer 150 and the interlayer insulating layer 190. The drain electrode 230 may be connected to a drain region of the active layer 130 through a second contact hole extended through the gate insulating layer 150 and the interlayer insulating layer 190 such as by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These may be used alone or in combination with each other. In embodiments, each of the source electrode 210 and the drain electrode 230 may have a multilayer structure including a plurality of metal layers. In an embodiment, for example, the metal layers may have mutually different thicknesses, or may include mutually different materials.

Accordingly, the semiconductor element 250 including the active layer 130, the gate insulating layer 150, the gate electrode 170, the interlayer insulating layer 190, the source electrode 210, and the drain electrode 230 may be provided.

However, although the semiconductor element 250 has been described as having a top gate structure, the invention is not limited thereto. In an embodiment, for example, the semiconductor element 250 may have a bottom gate structure, a double gate structure, or the like.

In addition, although the display device 100 has been described as including one of the semiconductor element 250, the invention is not limited thereto. In an embodiment, for example, the display device 100 may include at least one of the semiconductor element 250 and at least one storage capacitor.

The planarization layer 270 may be disposed on the interlayer insulating layer 190, the source electrode 210, and the drain electrode 230. In an embodiment, for example, the planarization layer 270 may have a relatively large thickness. In this case, the planarization layer 270 may have a substantially flat top surface. In order to implement such a flat top surface of the planarization layer 270, a planarization process may be additionally performed on material layer of the planarization layer 270. In embodiments, the planarization layer 270 may be disposed along a profile of the source electrode 210 and the drain electrode 230 with a uniform thickness on the interlayer insulating layer 190. The planarization layer 270 may include or be formed of an organic material or an inorganic material. In the embodiments, the planarization layer 270 may include an organic material. In an embodiment, for example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 290 may be disposed on the planarization layer 270. The lower electrode 290 may be connected to the drain electrode 230 through a contact hole extended through the planarization layer 270 such as by removing a part of the planarization layer 270, and the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In embodiments, the lower electrode 290 may have a multilayer structure including a plurality of metal layers. In an embodiment, for example, the metal layers may have mutually different thicknesses, or may include mutually different materials.

The pixel defining layer 310 may be disposed on the planarization layer 270. In an embodiment, for example, the pixel defining layer 310 may cover both side portions of the lower electrode 290 while exposing a part of a top surface of the lower electrode 290. The pixel defining layer 310 may include or be formed of an organic material or an inorganic material. In the embodiments, the pixel defining layer 310 may include an organic material.

The light emitting layer 330 may be disposed on the pixel defining layer 310 and the lower electrode 290. The light emitting layer 330 may include or be formed by using at least one of light emitting materials for emitting different color lights (e.g., a red light, a green light, a blue light, etc.) according to pixels of the display region 10. Alternatively, a same one of the light emitting layer 330 may be provided or formed by stacking a plurality of light emitting materials for generating different color lights such as a red light, a green light, and a blue light to emit a white light as a whole. In this case, a color filter may be disposed on the light emitting layer 330 disposed on the lower electrode 290. The color filter may include at least one of a red color filter, a green color filter, and a blue color filter. In embodiments, the color filter may include a yellow color filter, a cyan color filter, and a magenta color filter. The color filter may include a photosensitive resin or a color photoresist.

The upper electrode 340 may be disposed on the light emitting layer 330 and the pixel defining layer 310. The upper electrode 340 may include a metal, an alloy, metal nitride, conductive metal oxide, a transparent conductive material, and the like. These may be used alone or in combination with each other. In embodiments, the upper electrode 340 may have a multilayer structure including a plurality of metal layers. In an embodiment, for example, the metal layers may have mutually different thicknesses, or may include mutually different materials.

Accordingly, the display structure 200 as a display element of the display region 10 which includes the lower electrode 290, the light emitting layer 330, and the upper electrode 340 may be provided.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may reduce or effectively prevent the light emitting layer 330 from deteriorating due to penetration of moisture, oxygen, and the like. In addition, the first inorganic thin film encapsulation layer 451 may perform a function of protecting the display device 100 from an external impact. The first inorganic thin film encapsulation layer 451 may include inorganic materials having flexibility.

The organic thin film encapsulation layer 452 may be disposed on the first inorganic thin film encapsulation layer 451. The organic thin film encapsulation layer 452 may improve flatness of the display device 100, and may protect the display device 100. The organic thin film encapsulation layer 452 may include organic materials having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may reduce or prevent the light emitting layer 330 from deteriorating due to the penetration of moisture, oxygen, and the like together with the first inorganic thin film encapsulation layer 451. In addition, the second inorganic thin film encapsulation layer 453 may perform a function of protecting the display device 100 from an external impact together with the first inorganic thin film encapsulation layer 451 and the organic thin film encapsulation layer 452. The second inorganic thin film encapsulation layer 453 may include inorganic materials having flexibility.

Accordingly, the thin film encapsulation structure 450 including the first inorganic thin film encapsulation layer 451, the organic thin film encapsulation layer 452, and the second inorganic thin film encapsulation layer 453 in order may be provided, and the display device 100 including the substrate 110, the semiconductor element 250, the planarization layer 270, the display structure 200, the pixel defining layer 310, and the thin film encapsulation structure 450 in order may be provided.

However, although the display device 100 has been described as specifically being an organic light emitting diode display device, the invention is not limited thereto. In embodiments, the display device 100 may include a liquid crystal display device ("LCD"), a field emission display device ("FED"), a plasma display device ("PDP"), or an electrophoretic display device ("EPD").

Figure 7:
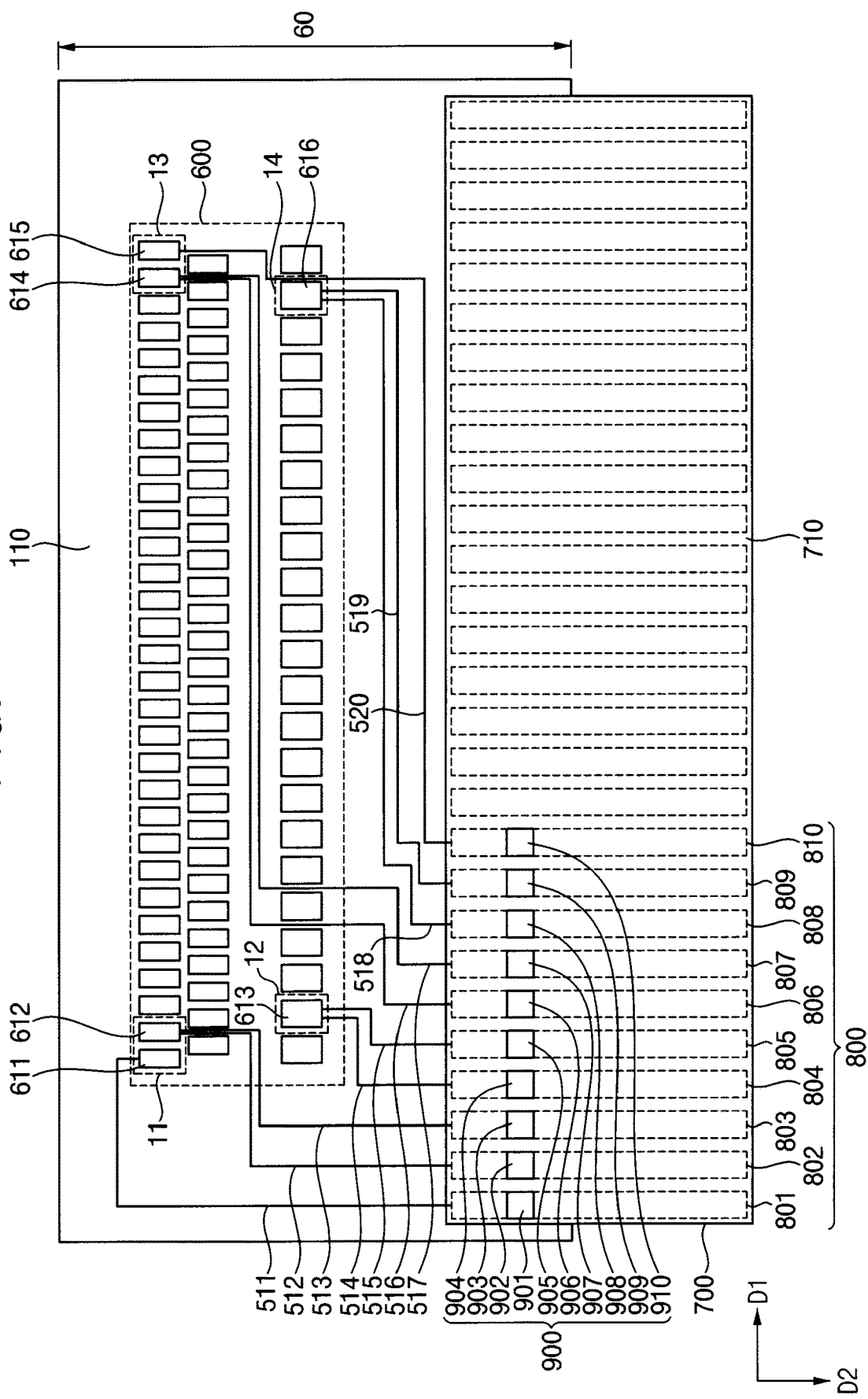
FIG. 7 is a plan view for describing an embodiment of a method of inspecting a contact status between a substrate and a driving integrated circuit.

FIG. 7 is a plan view for describing an embodiment of a method of inspecting a contact status between a substrate 110 and a driving integrated circuit 600.

Referring to FIG. 7, the bump electrodes 800 of the flexible circuit board 700 may include first to tenth bump electrodes 801, 802, 803, 804, 805, 806, 807, 808, 809, and 810, and the test points 900 may include first to tenth test points 901, 902, 903, 904, 905, 906, 907, 908, 909, and 910 on a top surface of the base substrate 710.

In an inspection apparatus, first to tenth probe pins may be provided. The first to tenth probe pins may be electrically connected to the inspection device which inspects the contact status between the substrate 110 and the driving integrated circuit 600. In an embodiment, for example, the first to tenth probe pins may make contact with the first to tenth test points 901, 902, 903, 904, 905, 906, 907, 908, 909, and 910, respectively. In an embodiment, for example, while grounding the third probe pin and providing an electrical current through the fourth probe pin, the inspection device may measure a voltage difference through the first probe pin and the second probe pin to obtain a resistance value (e.g., electrical resistance) of the second test bump 612 of the driving integrated circuit 600 (e.g., first measurement). After the first measurement, while grounding the fifth probe pin and providing an electrical current through the sixth probe pin, the inspection device may measure a voltage difference through the third probe pin and the fourth probe pin to obtain a resistance value of the third test bump 613 of the driving integrated circuit 600 (e.g., second measurement). After the second measurement, while grounding the seventh probe pin and providing an electrical current through the eighth probe pin, the inspection device may measure a voltage difference through the fifth probe pin and the sixth probe pin to obtain a resistance value of the fourth test bump 614 of the driving integrated circuit 600 (e.g., third measurement). After the third measurement, while grounding the ninth probe pin and providing an electrical current through the tenth probe pin, the inspection device may measure a voltage difference through the seventh probe pin and the eighth probe pin to obtain a resistance value of the sixth test bump 616 (e.g., fourth measurement).

As described above, a test signal (e.g., one or more of electrical test signals) may be provided to the substrate 110 and to the driving integrated circuit 600 via the flexible circuit board 700 and the test pads 500. Accordingly, the contact status between the substrate 110 and the driving integrated circuit 600 may be inspected by comparing the resistance values of the second, third, fourth, and sixth test bumps 612, 613, 614, and 616 of the driving integrated circuit 600 which are at four corner thereof. In other words, since the circuit wire 650 electrically connects the first to sixth test bumps 611, 612, 613, 614, 615, and 616 to each other, the inspection as described above may be possible. In an embodiment, based on the voltage difference measured through various probe pins to obtain a resistance value of one or more respective test bumps of the driving integrated circuit 600, via various test pads 500 and connection wires among the first to tenth connection wires 511, 512, 513, 514, 515, 516, 517, 518, 519, and 520 of the substrate 110, a contact status of the driving integrated circuit 600 relative to the substrate 110 may be determined.

One or more embodiment of the invention may be applied to various electronic devices including a display device 100. In an embodiment, for example, the display device 100 may be applied to numerous electronic devices such as vehicle-display devices, ship-display devices, aircraft-display devices, portable communication devices, display devices for a display or for an information transfer, medical-display devices, etc.

The foregoing is illustrative of embodiments and is not to be construed as limiting. Although embodiments have been described, those skilled in the art will readily appreciate that many modifications are possible in the embodiments without materially departing from the novel teachings and features of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as embodiments, are intended to be included within the scope of the appended claims.

What is claimed is:

1. A display device comprising:
    a substrate including:
        a display region including a display structure which displays an image, and
        a pad region through which an electrical signal is provided to the display region;
    a driving integrated circuit which contacts the substrate at the pad region thereof and includes:
        a plurality of test bumps which receive test signals from outside the driving integrated circuit, the plurality of test bumps including a first test bump, a second test bump and a third test bump,
        a first region including both the first test bump and the second test bump,
        a second region including the third test bump and spaced apart from the first region, and
        a circuit wire commonly connected to each of the first test bump, the second test bump and the third test bump;
    a plurality of test pads in the pad region and through which the test signals are provided to the driving integrated circuit from outside the substrate, the plurality of test pads including first to tenth test pads spaced apart from the driving integrated circuit and arranged along a first direction; and
    a plurality of connection wires in the pad region and through which the test signals are provided to the plurality of test bumps from the plurality of test pads, the plurality of connection wires including:
        a first connection wire which connects the first test pad to the first test bump of the driving integrated circuit;
        second and third connection wires which connect the second and third test pads, respectively, to the second test bump of the driving integrated circuit; and
        fourth and fifth connection wires which connect the fourth and fifth test pads, respectively, to the third test bump of the driving integrated circuit.

2. The display device of claim 1, wherein the driving integrated circuit further includes:
    a third region and a fourth region spaced apart from each of the first region and the second region,
    the first region and the third region spaced apart from each other along the first direction,
    the second region and the fourth region spaced apart from each other along the first direction,
    the first region and the second region spaced apart from each other along a second direction crossing the first direction, and
    the third region and the fourth region spaced apart from each other along the second direction.

3. The display device of claim 1, wherein the driving integrated circuit further includes:
    the plurality of test bumps further including fourth and fifth test bumps, and
    a third region including both the fourth and fifth test bumps and spaced apart from each of the first region and the second region.

4. The display device of claim 3, wherein within the driving integrated circuit the circuit wire is commonly connected to the first to fifth test bumps.

5. The display device of claim 3, wherein the plurality of connection wires further includes sixth and seventh connection wires which connect the sixth and seventh test pads, respectively, to the fourth test bump.

6. The display device of claim 3, wherein the driving integrated circuit further includes:
a plurality of output signal bumps through which the electrical signal is provided to the display region of the substrate from the driving integrated circuit, and
each of the plurality of output signal bumps between the first region including the first and second test bumps and the third region including the fourth and fifth test bumps.

7. The display device of claim 6, wherein the plurality of output signal bumps of the driving integrated circuit are electrically connected to the display structure of the display region.

8. The display device of claim 3, wherein the driving integrated circuit further includes:
the plurality of test bumps further including a sixth test bump, and
a fourth region including the sixth test bump and spaced apart from each of the first region, the second region and the third region.

9. The display device of claim 8, wherein within the driving integrated circuit the circuit wire is commonly connected to the first to sixth test bumps.

10. The display device of claim 9, wherein the plurality of connection wires further includes:
eighth and ninth connection wires which connect the eighth and ninth test pads, respectively, to the sixth test bump; and
a tenth connection wire which connects the tenth test pad to the fifth test bump.

11. The display device of claim 8, wherein the driving integrated circuit further includes:
a plurality of input signal bumps through which the electrical signal is provided to the driving integrated circuit from outside thereof, and
each of the plurality of input signal bumps between the second region including the third test bump and the fourth region including the sixth test bump.

12. The display device of claim 11, further comprising:
a plurality of signal pads in the pad region and through which the electrical signal is provided to the driving integrated circuit from outside thereof, and
the plurality of signal pads adjacent to the first to tenth test pads along the first direction.

13. The display device of claim 12, wherein within the pad region, the plurality of input signal bumps of the driving integrated circuit are electrically connected to the plurality of signal pads.

14. The display device of claim 8, wherein the driving integrated circuit further includes:
first, second, third, and fourth corners, and
among the first to sixth test bumps:
the first and second test bumps are closest to the first corner,
the third test bump is closest to the second corner,
the fourth and fifth test bumps are closest to the third corner, and
the sixth test bump is closest to the fourth corner.

15. The display device of claim 1, wherein the pad region is adjacent to one side of the display region.

16. The display device of claim 1, wherein the driving integrated circuit further includes:
a body portion;
the first test bump, the second test bump and the third test bump each exposed outside of the body portion; and
the circuit wire embedded in the body portion and commonly connected to each of the first to third test bumps.

17. A display device comprising:
a substrate including:
a display region including a display structure,
a pad region through which an electrical signal is provided to the display region;
a plurality of test pads in the pad region and through which electrical test signals are provided to the pad region from outside the substrate; and
a plurality of connection wires in the pad region and through which the electrical test signals are provided from the plurality of test pads,
a driving integrated circuit which contacts the substrate at the pad region thereof, the driving integrated circuit including:
a plurality of test bumps which are connected to the plurality of test pads by the plurality of connection wires and receive the electrical test signals from the plurality of test pads, and
a circuit wire commonly connected to each of the plurality of test bumps;
wherein the plurality of connection wires of the substrate includes:
a first connection wire which connects a first test pad among the plurality of the test pads of the substrate to a first test bump among the plurality of test bumps of the driving integrated circuit; and
a plurality of second connection wires which are different from the first connection wire and respectively connects a plurality of second test pads different from the first test pad among the plurality of the test pads of the substrate to a same second test bump different from the first test bump among the plurality of test bumps of the driving integrated circuit.

18. The display device of claim 17, wherein within the driving integrated circuit, the first test bump which is connected to the first test pad by the first connection wire and the same second test bump which is connected to the plurality of second test pads different from the first test pad by the plurality of second connection wires, respectively, are at opposing sides of the driving integrated circuit.

19. The display device of claim 17, wherein
the substrate further includes:
a plurality of signal pads in the pad region and through which the electrical signal is provided to the driving integrated circuit from outside the substrate, and
an edge which is furthest from the display region with the pad region therebetween and extends along a first direction,
the driving integrated circuit further includes:
a plurality of input signal bumps through which the electrical signal is provided to the driving integrated circuit from the plurality of signal pads of the substrate, and
a plurality of output signal bumps through which the electrical signal is provided to the display region of the substrate from the driving integrated circuit,
along the edge of the substrate the plurality of signal pads are adjacent to the plurality of test pads along the first direction, and within the driving integrated circuit the plurality of output signal bumps are adjacent to the first test bump along the first direction.

\* \* \* \* \*